United States Patent
Krymski

(10) Patent No.: US 7,511,755 B2
(45) Date of Patent: Mar. 31, 2009

(54) LOW-POWER SIGNAL CHAIR FOR IMAGE SENSORS

(75) Inventor: Alexander I. Krymski, Montrose, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 641 days.

(21) Appl. No.: 11/059,628

(22) Filed: Feb. 17, 2005

(65) Prior Publication Data
US 2005/0195300 A1 Sep. 8, 2005

Related U.S. Application Data

(63) Continuation of application No. 09/590,785, filed on Jun. 8, 2000, now Pat. No. 6,873,364.

(51) Int. Cl.
*H04N 5/335* (2006.01)

(52) U.S. Cl. .................. 348/308; 348/300; 348/302

(58) Field of Classification Search .............. None
See application file for complete search history.

(56) References Cited

U.S. PATENT DOCUMENTS

| | | | |
|---|---|---|---|
| 5,852,415 A | 12/1998 | Cotter et al. | |
| 5,929,800 A * | 7/1999 | Zhou et al. | 341/161 |
| 5,949,483 A | 9/1999 | Fossum et al. | |
| 6,124,821 A | 9/2000 | Pezzini et al. | |
| 6,201,572 B1 | 3/2001 | Chou | |
| 6,239,839 B1 * | 5/2001 | Matsunaga et al. | 348/308 |
| 6,320,616 B1 | 11/2001 | Sauer | |
| 6,476,864 B1 | 11/2002 | Borg et al. | |

* cited by examiner

*Primary Examiner*—Thai Thai
*Assistant Examiner*—Heather R Jones
(74) *Attorney, Agent, or Firm*—Dickstein Shapiro LLP

(57) ABSTRACT

A signal chain for an image sensor is disclosed. The signal chain includes photo sensing elements, pixel readout circuits, and an amplifier. Each pixel readout circuit receives a charge-induced signal and a reset signal from one of the photo sensing elements. The readout circuit computes a difference signal between the charge-induced signal and said reset signal. The difference signal is measured with respect to a reference signal. The amplifier is coupled to the pixel readout circuits, and configured to supply the reference signal during computation of the difference signal. Further, the amplifier amplifies the difference signal when the computation is done.

10 Claims, 7 Drawing Sheets

LOW-POWER SIGNAL CHAIR FOR IMAGE SENSORS

This application is a continuation of application Ser. No. 09/590,785 filed Jun. 8, 2000 (now U.S. Pat. No. 6,873,364), which is hereby incorporated by reference in its entirety.

BACKGROUND

The present disclosure generally relates to image sensors, and specifically to a low-power signal chain in such sensors.

Image sensors can be applied in a variety of fields, including machine vision, robotics, guidance and navigation, automotive applications, and consumer products. In "smart" image sensors, it is often desirable to integrate on-chip circuitry to control the image sensor and to perform signal and image processing on the output image.

Active pixel sensors (APS), which have one or more active transistors within the pixel unit cell, can be made compatible with CMOS technologies. An active pixel sensor is often arranged as an array of elements referred to as a pixel array. Each column of the array can be read out at one time, driven and buffered for sensing by a signal chain including a readout circuit, an output stage, and an A-to-D converter.

SUMMARY

The present disclosure defines a signal chain for an image sensor. The signal chain includes photo sensing elements, pixel readout circuits, and an amplifier. Each pixel readout circuit receives a charge-induced signal and a reset signal from a photo-sensing element. The readout circuit computes a difference signal between the charge-induced signal and the reset signal. The difference signal is measured with respect to a reference. The amplifier is coupled to the pixel readout circuits, and configured to supply the reference during computation of the difference signal. Further, the amplifier amplifies the difference signal when the computation is completed.

The present disclosure further includes a method for is pixel readout. The method includes reading a charge-induced signal and a reset signal from a first series of pixels. The method also includes computing a first difference signal between the charge-induced signal and the reset signal, and enabling a first A-to-D converter to convert the first difference signal to a first digital value. The method further reads another charge-induced signal and another reset signal from a second series of pixels while the first A-to-D converter is performing conversion. A second difference signal between another charge-induced signal and another reset signal is then computed. Finally, a second A-to-D converter converts the second difference signal to a second digital value.

An image sensor circuit further includes a pixel array addressing circuit and a controller.

BRIEF DESCRIPTION OF THE DRAWINGS

Different aspects of the disclosure will be described in reference to the accompanying drawings wherein.

DETAILED DESCRIPTION

Figure 1:
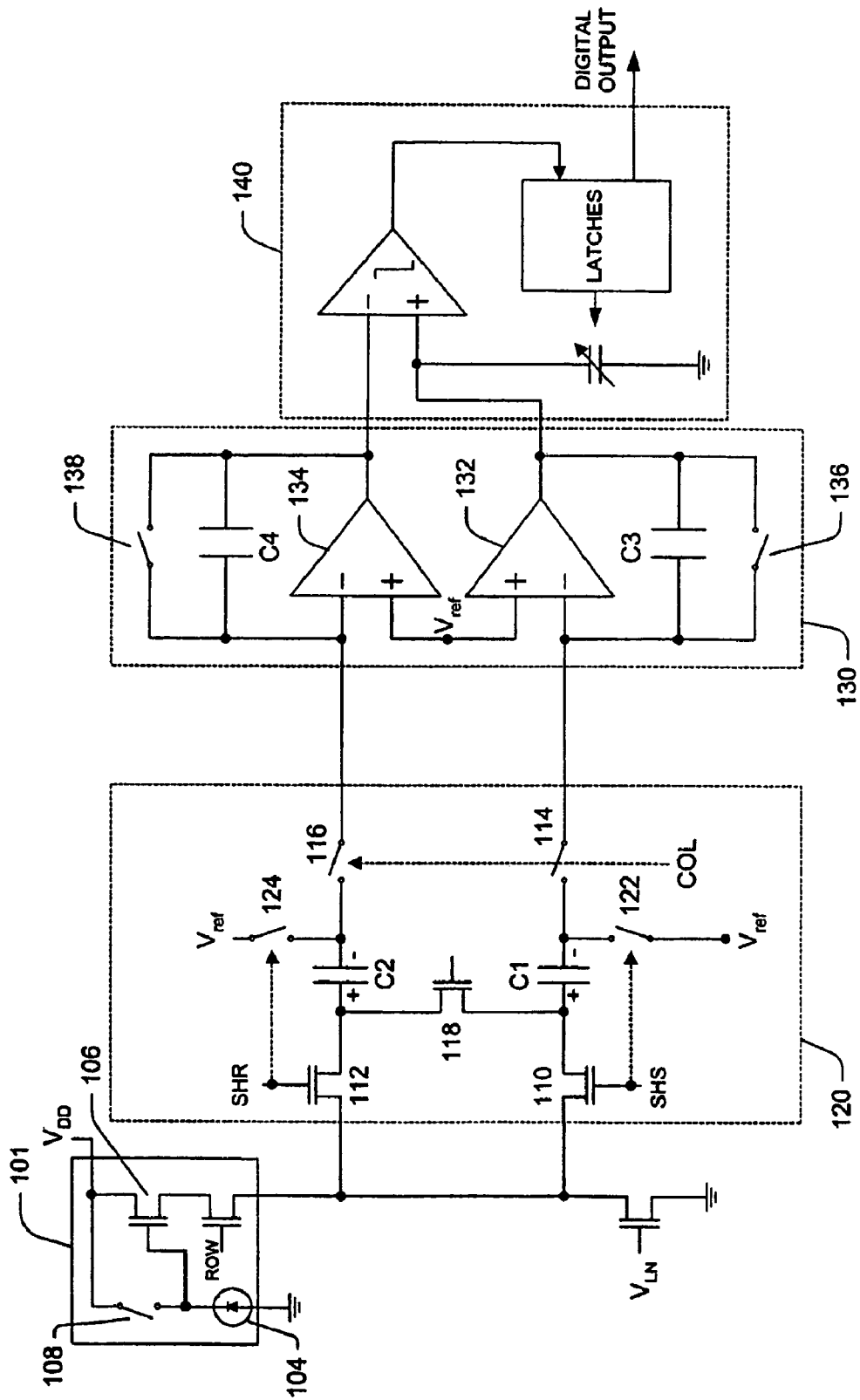
FIG. 1 is an examplary conventional signal chain.

The operation of an examplary signal chain of FIG. 1 is explained below. In general, the signal chain operates in a double sampling differential mode.

The signal value on a photosensitive pixel element 104 is switched through the source-follower transistor 106 and the transistor 110 to the capacitor $C_1$. After the capacitor $C_1$ is charged to the proper voltage, the photosensitive element 104 is reset using the reset switch 108. The reset level of the pixel 101 is sampled by the transistor 112, and stored on the capacitor $C_2$. The negative plates of the capacitors $C_1$, $C_2$ can be clamped during appropriate times. The capacitors are clamped at a reference voltage ($V_{REF}$) by closing associated switches 122, 124, respectively.

After the initial sampling steps, the capacitors $C_1$ $_{and\ C2}$, respectively, hold signal and reset values. The signal and reset values are sent from the respective column readout circuits 120 to the output stage 130 through a pair of column select switches 114, 116. The column readout circuits 120 are read sequentially, e.g. one at a time.

When the switches 114, 116 are first turned on, the integrators 132, 134 are held in reset by the switches 136, 138. Resetting the switched integrators 132, 134 erases any previously-stored signals. The reset action also restores the reference voltage ($V_{REF}$) to the inverting inputs of the integrators 132, 134. Substantially simultaneously, the crowbar transistor 118 is turned on to short together the common sides of capacitors $C_1$, $C_2$. This provides charge from capacitors $C_1$, $C_2$ through the respective switches 114, 116 and to the integrators 132, 134. The charge from the capacitors $C_1$, $C_2$ is coupled onto the integrators' capacitors $C_3$, $C_4$. The effect is that the charge is driven through the circuit of the system and offsets are reduced.

Once the signal and reset values stored in one of the column readout circuits 120 has been read by the output stage 130, the values are converted to a digital signal by an A-to-D converter 140. The signal and reset values stored in other column readout circuits can be read sequentially by the output stage. When all the pixels from the selected row have been read by the output stage 130, the process can be repeated for a new row of pixels in the pixel array.

Figure 2A:
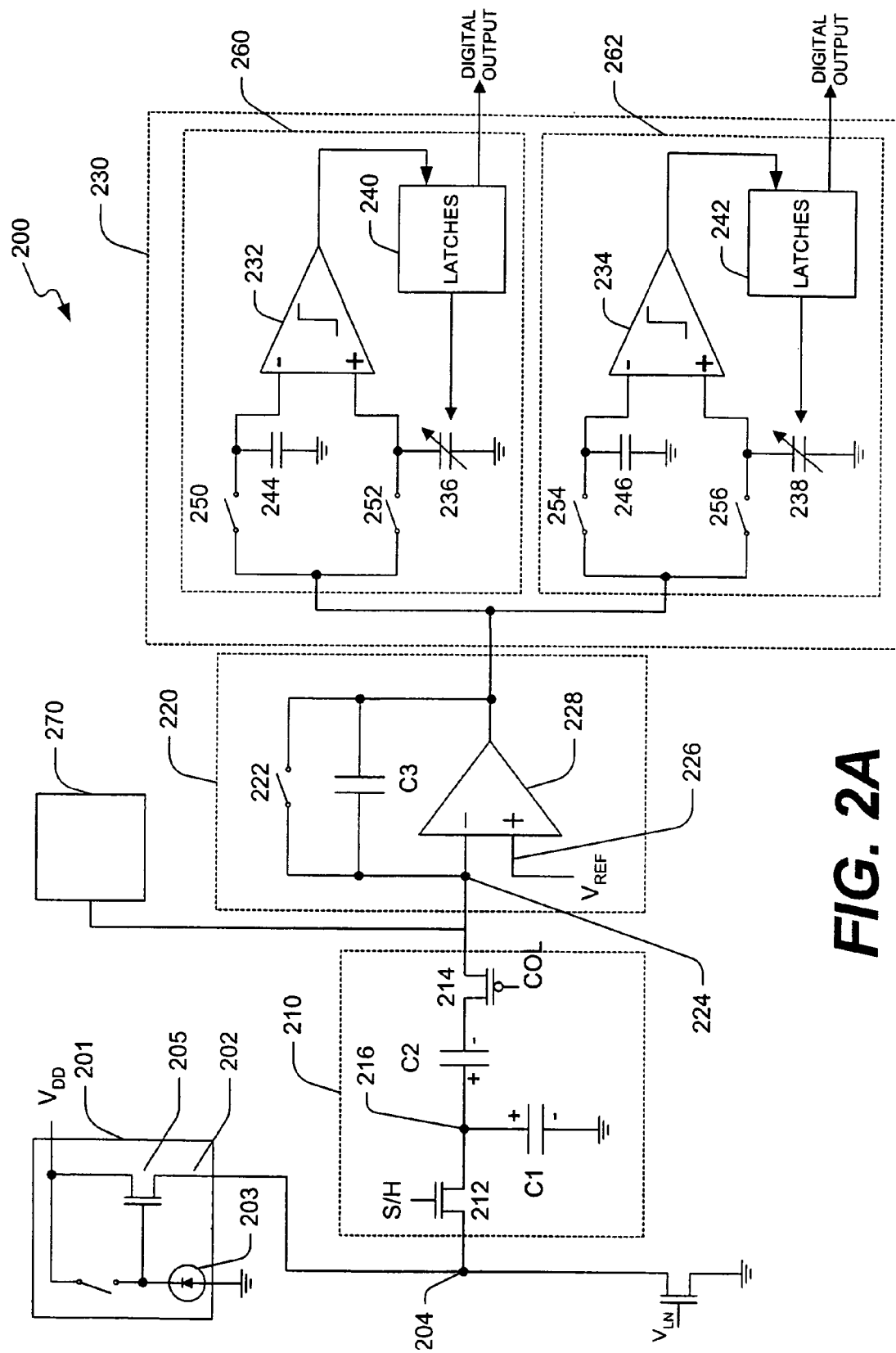
FIG. 2A shows a low-power signal chain in accordance with an embodiment of the present system.

The present system defines a low-power signal chain for a CMOS image sensor. One embodiment of the low-power signal chain 200 in accordance with the present system is shown in FIG. 2A. The signal chain 200 includes a column readout circuit 210, an output charge detection amplifier 220, and a capacitive successive approximation A-to-D converter system 230.

All pixels in a column are connected in parallel with switching circuits that control which of the pixels of the column is output at any one time. The signal from each selected pixel circuit 201 arrives at the column input 204. The signal is typically a negative charge amount that subtracts from the high level reset.

The active pixel sensor pixel circuit 201 includes a photosensor 203, and an in-pixel follower amplifier 205. Photosensor 203 can include, for example, a photodiode, a photogate or a charge injection device. The output signal 202 is a sequence of low (signal) and high (reset) voltages. The output is connected to capacitors $C_1$, $C_2$ that carry out a sampling operation between the output voltages that are output at different times.

A typical double sampling operation first samples the output voltage. That voltage is the level of the reset.

Next output voltage is the level of the photo-charge-induced signal, added to the supply voltage, here $V_{DD}$.

During the time that the pixel signal 202 is "active", metal oxide semiconductor field-effect transistors (MOSFET) 212, 214 and a switch 222 are all turned on (closed). This applies the signal to the stages 210 and 220. The sample and hold (S/H) transistor 212 is maintained on during that time by the S/H voltage that drives the gate of the transistor 212. While the S/H voltage is high, the charge-induced voltage passes through the sample and hold transistor 212, and is accumulated by the capacitors $C_1$, $C_2$. The capacitor $C_1$ is connected from S/H node 216 to the ground and the second capacitor $C_2$ is connected in series with S/H transistor 212.

When the column selection transistor 214 is on, the negative plate of $C_2$ is charged to the voltage at the negative input node 224 of the amplifier 228. With the feedback switch 222 closed, the negative input node 224 of the amplifier 228 settles to about the same level as the reference voltage ($V_{REF}$) at the positive input node 226. The negative plate of the pass-through capacitor $C_2$ may otherwise need clamping to a reference voltage. Other advantages include substantial reduction in switch feed-through error caused by sample and hold transistor 212 and offset errors caused by a reference voltage.

Once the pixel signal 202 is sampled, the column selection switch 214 is turned off. The reset voltage may be sampled onto the capacitor $C_1$. The capacitor $C_2$ then settles to a charge related to a signal level minus a reset level. When the column selection switch 214 is turned on again, the difference signal of the result (signal minus reset plus reference) is applied to the inverting amplifier stage 220 that includes feedback capacitor $C_3$.

For low voltage operation, the transistor switch 212 operates with signal close to the ground, while the transistor switch 214 passes a reference voltage from amplifier close to the supply voltage. Therefore, it is preferred that transistor switches 212 and 214 be n-channel MOSFET (NMOS) transistor and p-channel MOSFET (PMOS) transistor, respectively.

The amplifier circuit 220 includes an op-amp 228, which uses a voltage reference ($V_{REF}$) that biases the op-amp 228 to a desired operating point. The op-amp 228 is preferably a trans-impedance op-amp that extends the dynamic range of the signals. The value of the reference voltage is selected to be about 0.5 volts below the supply voltage ($V_{DD}$).

The amplifier circuit 220 further includes a feedback switch 222 and a feedback capacitor $C_3$. The gain (G) of the charge sensing amplifier circuit 220 is determined by the capacitance that is selectively coupled to an inverting input 224 of the op-amp 228 through the column selection transistor 214. Therefore, the gain of the amplifier circuit is approximately equal to the ratio of the effective capacitance seen by the inverting terminal 224 of the op-amp 228 and the value of the feedback capacitor $C_3$.

Figure 2B:
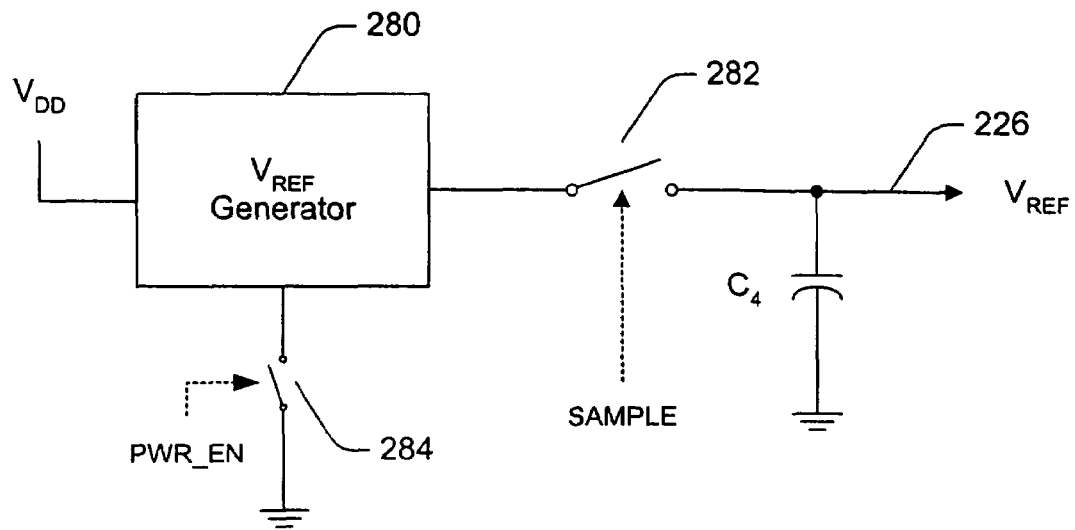
FIG. 2B shows a sample-and-hold circuit for the reference voltage generator in accordance with an embodiment of the present invention.

To achieve low-noise operation in the column readout circuit 210 and the amplifier circuit 220, the voltage reference ($V_{REF}$) needs to be substantially stable. In particular, the signal ripple during critical operational periods should be substantially less than the fundamental noise, such as shot noise or dark signal noise, in the sensor. The critical periods include pixel signal sampling, amplifier reset, and column charge readout. Thus, given the desired stability for the reference voltage during one row time, a sample-and-hold circuit shown in FIG. 2B is provided for the reference voltage.

The sample-and-hold circuit includes a voltage reference generator 280, a plurality of switches 282, 284, and a charge capacitor $C_4$. The voltage reference generator 280 generates a reference voltage, which may be noisy. The switches 282, 284 operate to sample the generated reference voltage onto the charge capacitor $C_4$. The reference voltage is sampled onto the charge capacitor $C_4$ at the beginning of each row sample time. The sampling switch 282 is then opened while the sampled voltage is held constant by the charge capacitor $C_4$ until the next row sample time. Since the sampling period is short compared to the entire row select period, the sample-and-hold circuit also saves power for the amplifier circuit 220. The output of the sample-and-hold circuit 226 is connected to the positive input of the amplifier 228 in the amplifier circuit 220.

Figure 2C:
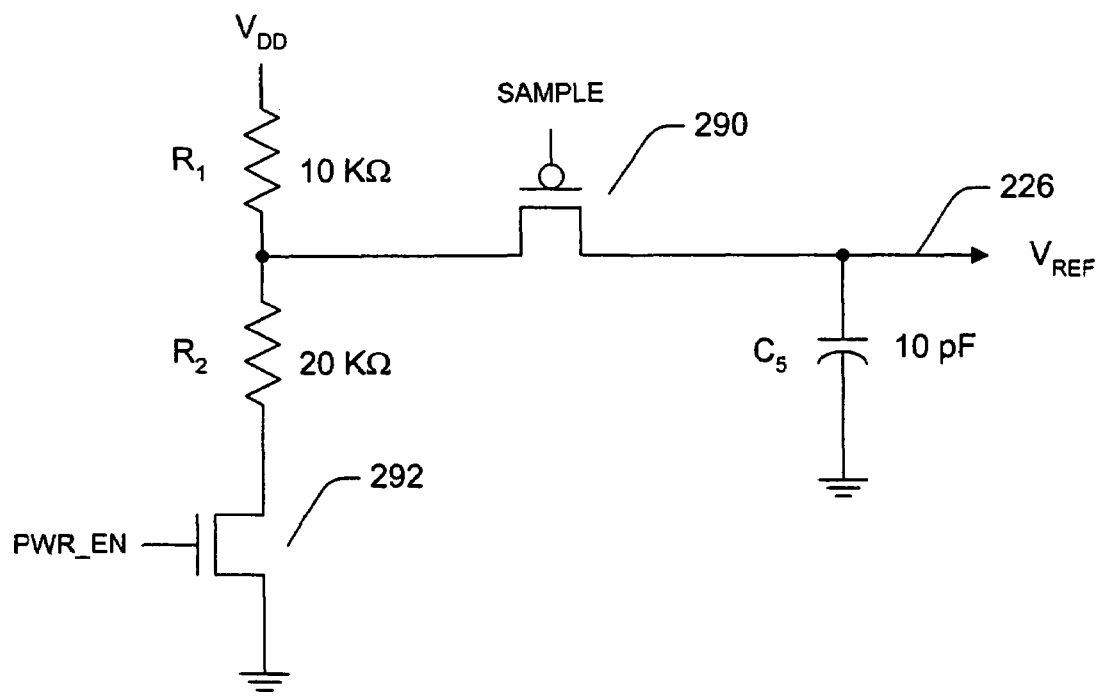
FIG. 2C is a schematic diagram of the sample-and-hold circuit shown in FIG. 2B.

In one implementation of the sample-and-hold circuit, shown in FIG. 2C, the voltage reference generator 280 is implemented with two resistors $R_1$, $R_2$ configured as a voltage divider. Since the values of $R_1$ and $R_2$ are 10KΩ and 20 KΩ respectively, the generated reference voltage is about 67% of the supply voltage, $V_{DD}$. The switches may be implemented with p-channel 290 and n-channel MOSFET transistors 292. The capacitor $C_5$ may be 10 pF.

Figure 2D:
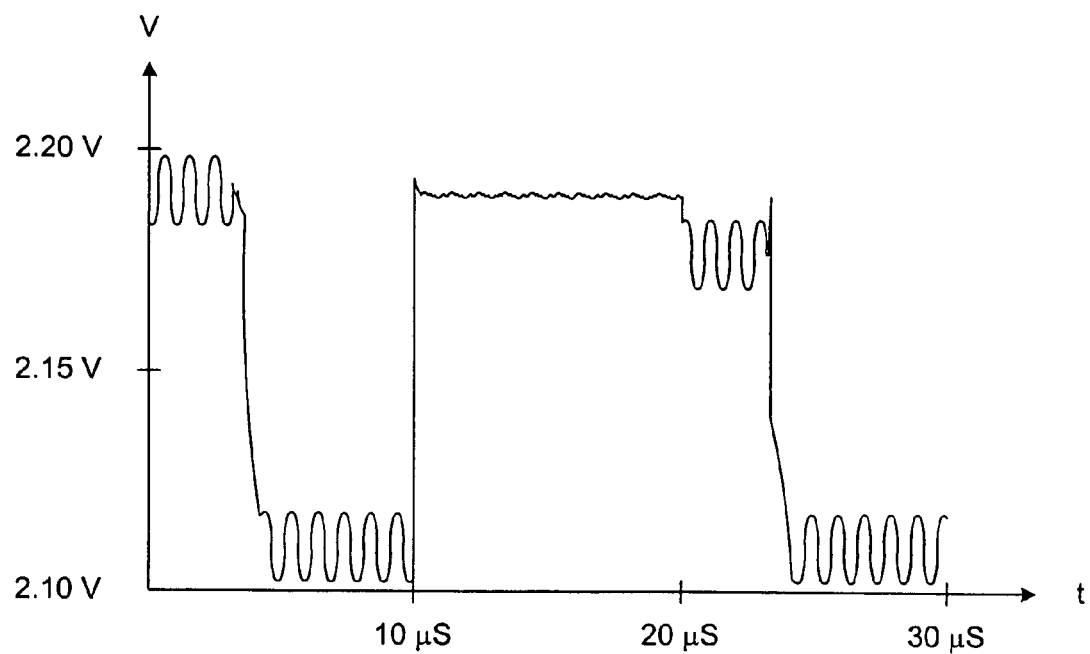
FIGS. 2D and 2E show output plots of an amplifier without and with the sample-and-hold circuit inserted into the voltage reference generator, respectively.

FIG. 2D is an output plot of the amplifier showing the sample and reset signals. The plot was generated without the sample-and-hold circuit. The plot shows the voltage ripple on the order of about 10 mV, which corresponds to about 5%.

Figure 2E:
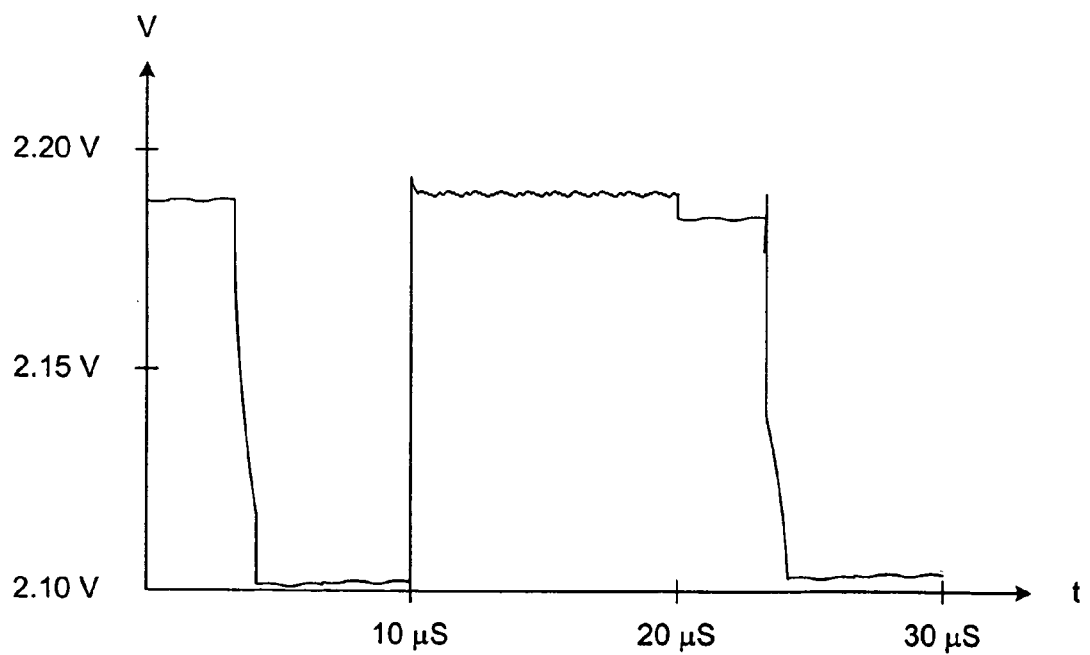

FIG. 2E is an output plot of the same amplifier with the sample-and-hold circuit inserted into the voltage reference generator. The plot shows the negligible ripple on the output of the amplifier.

The amplified differential analog signal is then converted to a corresponding digital data by A-to-D converter system 230. For one embodiment, the A-to-D converter system 230 includes two comparators 232, 234 and a binary-scaled network of capacitors 236, 238. A "strobe" signal enables the comparators 232, 234 to provide an output signal based on the signals at its positive and negative terminals. The binary-scaled capacitor network 236, 238 is used to approximate the amplified differential pixel signal using a successive approximation technique.

The result of the comparison for the binary-scaled capacitor network 230 is stored by the associated one of the latches 240, 242. The values of the digital bits corresponding to the analog differential pixel signal are stored by the respective latches 240, 242 while the amplification and conversion steps are performed for the pixel 201.

For readout, the amplifier 220 is initially preset by is closing the switch 222 and sampling this reset level onto the capacitor 244 through the switch 250. A column readout circuit 210 is connected to the amplifier 220 through the column selection switch 214. The pixel signal 202 is injected onto the binary-scaled capacitor 236 when the switch 252 is closed. The first A-to-D converter 260 then enters a conversion mode in which the binary-scaled capacitor 236 is successively programmed to convert the amplified differential signal. The switches 250, 252 are turned off during this conversion mode.

Substantially simultaneously with the beginning of the conversion mode of the first A-to-D converter 260, the amplifier 220 is again preset by closing the switch 222. This reset level is sampled onto the capacitor 246 through the switch 254. Another column readout circuit 270 is then connected to the amplifier 220 through another column selection switch. The pixel signal corresponding to this new column is injected onto the binary-scaled capacitor 238 when the switch 256 is closed. The second A-to-D converter 262 is in a sampling mode when the first A-to-D converter 260 is in a conversion mode.

Figure 3:
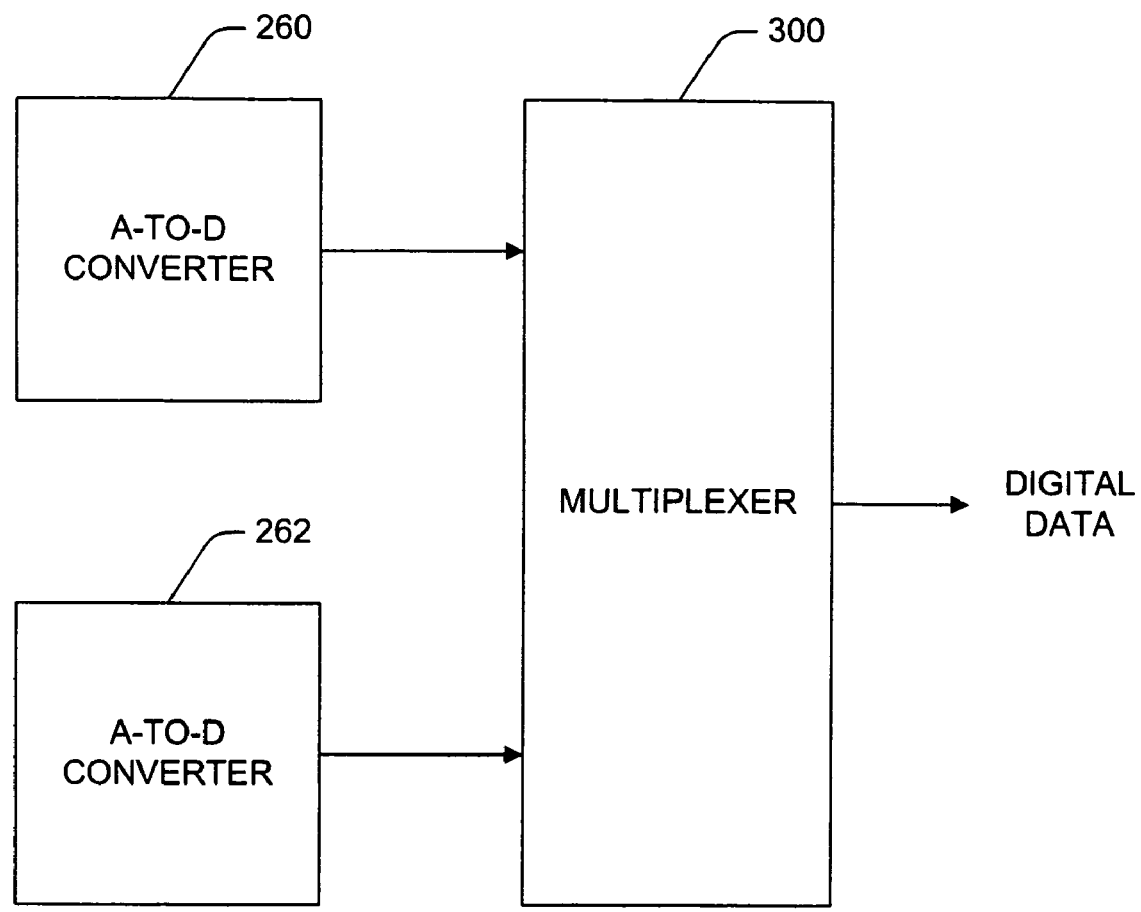
FIG. 3 is a block diagram of a multiplexer connected to two A-to-D converter according an embodiment of the present system.

FIG. 3 illustrates an advantage of the present system. A multiplexer 300 alternately outputs digital data produced by latches 240, 242 in the A-to-D converters 260, 262, respectively. The two A-to-D converters 260, 262 alternately perform sampling and conversion. Therefore, this configuration of having two A-to-D converters in a system 230 enables outputting of a continuous data stream without using extra memory.

Figure 4:
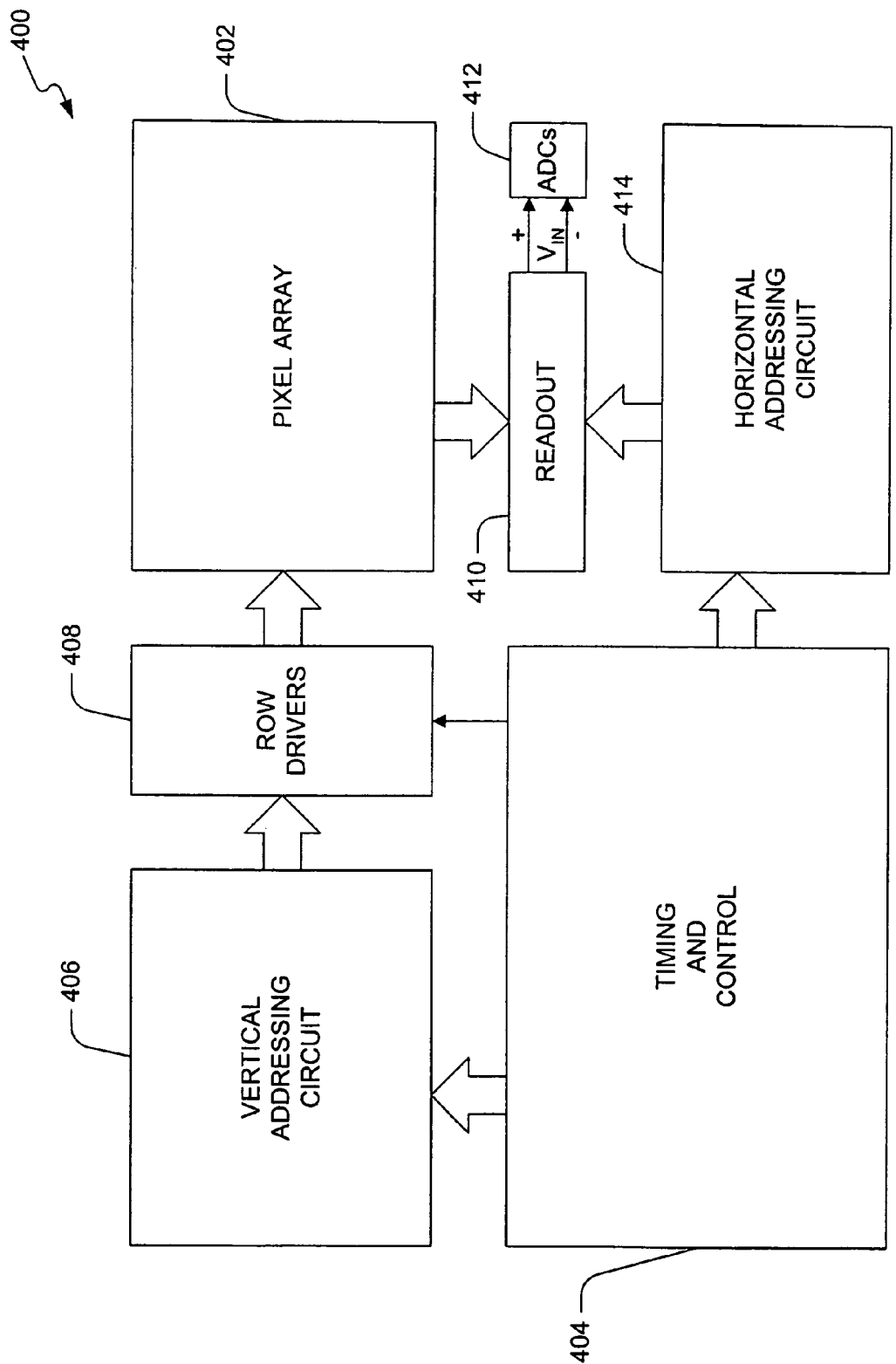
FIG. 4 shows an example of a CMOS image sensor integrated circuit chip.

FIG. 4 shows an example of a CMOS image sensor integrated circuit chip 400. The chip 400 includes an array of active pixel sensors 402 and a controller 404. The controller 404 provides timing and control signals to enable read out of signals stored in the pixels. For some embodiments, arrays can have dimensions of 128×128 or larger number of pixels. However, in general, the size of the array 402 will depend on the particular implementation. The image array 402 is read out a row at a time using column-parallel readout architecture. The controller 404 selects a particular row of pixels in the array 402 by controlling the operation of vertical addressing circuit 406 and row drivers 408. Charge signals stored in the selected row of pixels are provided to a readout circuit 410. The pixels read from each of the columns can be read out sequentially using a horizontal addressing circuit 414. Differential pixel signals ($V_{in}^+$, $V_{in}^-$) are provided at the output of the readout circuit 410. The differential pixel signals are sent to at least two A-to-D converters 412 to be converted to digital values. The readout circuit 410 and the A-to-D converter system 412 forms a low-power signal chain that performs sample and hold operation.

Figure 5:
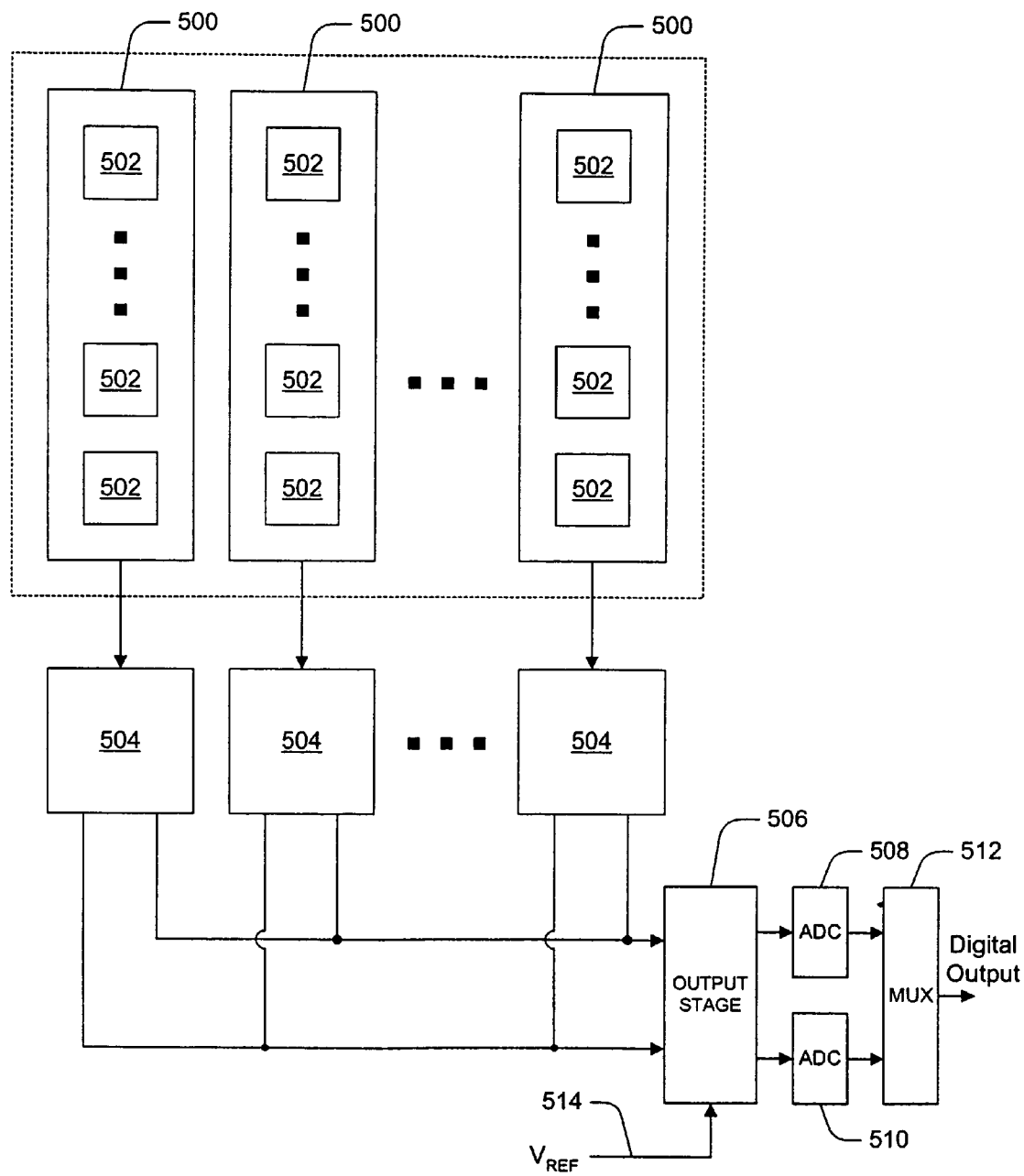
FIG. 5 shows an example of an image sensor pixel array with output stage.

As shown in FIG. 5, the array 402 includes multiple columns 500 of CMOS active pixel sensors 502. Each column includes multiple rows of sensors 502. Signals from the active pixel sensors 502 in a particular column can be read out to a readout circuit 504 associated with that column. Signals stored in the readout circuits 504 can be read to an output stage 506. This output stage 506 is common to the entire array of pixels 402. A-to-D converters 508, 510 convert analog signals to digital data. Multiplexer 512 successively strobes converted digital data into a stream of output data.

Some of the advantages of the present system are illustrated in FIG. 5 described above. The figure shows the reference voltage 514 being supplied to the output stage 506 instead of the column readout circuits 504 for all columns in the prior art system. Further, since the reference voltage 514 is applied to a high-impedance node (see FIG. 2A) of the op-amp, the current consumption in the present system is significantly less than that of the prior art system. Hence, the present system provides low-power signal chain for a CMOS active pixel sensor.

Other embodiments and variations are possible. For example, in a compact chip design, the capacitors C1 and C2 can be implemented as MOSFET capacitors.

All these are intended to be encompassed by the following claims.

What is claimed is:

1. An imaging apparatus, comprising:
a plurality of pixels, each for outputting at different times, a reset signal and a pixel signal;
a read out circuit comprising:
   a sampling circuit comprising:
      a column line for receiving said reset and pixel signals;
      a first sampling capacitor, said first sampling capacitor having a first plate for receiving said reset and pixel signals from said column line and a second plate for outputting a first output signal based on a voltage difference of said reset and pixel signals; and
      a first output line for receiving said first output signal; and
   an amplifying circuit, configured to amplify said first output signal into a second output signal, said amplifying circuit comprising:
      an amplifier having a first input coupled to said first output line and a second input coupled to a source of a reference voltage;
      a feedback network, coupled between an output of said amplifier and said first input; and
      a second output line, coupled in parallel to a first analog-to-digital converter and a second analog-to-digital converter.

2. The imaging apparatus of claim 1, wherein said first and second analog-to-digital converters each comprise:
a comparator;
a sample capacitor, coupled to a first input of said comparator;
a binary-scaled capacitor network, coupled to a second input of said comparator; and
a plurality of latches, coupled an output of said comparator.

3. The imaging apparatus of claim 2, wherein one of said first and second analog-to-digital converters is set into a first configuration for converting said second output signal in a particular cycle; and
another one of said first and second analog-to-digital converters is set into a second configuration for sampling a next second output signal; and
said first and second analog-to-digital converters are configured to switch configurations after said particular cycle.

4. The imaging apparatus of claim 1, wherein said feedback network comprises:
a switch for coupling said output of said amplifier to said first input of said amplifier, thereby providing said reference voltage to said first sampling capacitor.

5. An imager, comprising:
a pixel array, comprising a plurality of pixels for producing reset and pixel signals, said pixel array being organized into a plurality of rows and a plurality of columns;
addressing circuits, coupled to said pixel array, configured to select an addressed row of pixels from said pixel array; and
a plurality of read out circuits, each respectively associated with one column of said selected row of pixels and comprising:
   a sampling circuit comprising:
      a column line for receiving said reset and pixel signals;
      a first sampling capacitor, said first sampling capacitor having a first plate for receiving said reset and pixel signals from said column line and a second plate for providing a first output signal based on a voltage difference of said reset and pixel signals; and
      a first output line for receiving said first output signal; and an amplifying circuit, configured to amplify said first output signal into a second output signal, said amplifying circuit comprising:
  an amplifier having a first input coupled to said first output line and a second input coupled to a source of a reference voltage;
  a feedback network, coupled between an output of said amplifier and said first input; and
  a second output line, coupled in parallel to a first analog-to-digital converter and a second analog-to-digital converter.

6. The imager of claim 5, wherein said first and second analog-to-digital converters each comprise:
  a comparator;
  a sample capacitor, coupled to a first input of said comparator;
  a binary-scaled capacitor network, coupled to a second input of said comparator; and
  a plurality of latches, coupled an output of said comparator.

7. The imager of claim 6, wherein one of said first and second analog-to-digital converters is set into a first configuration for converting said second output signal in a particular cycle; and
  another one of said first and second analog-to-digital converters is set into a second configuration for sampling a next second output signal; and said first and second analog-to-digital converters are configured to switch configurations after said particular cycle.

8. The imager of claim 5, wherein said feedback network comprises:
  a switch for coupling said output of said amplifier to said first input of said amplifier, thereby providing said reference voltage to said first sampling capacitor.

9. The imaging apparatus of claim 1, wherein said first sampling capacitor is configured to settle to a voltage difference between said photo and reset signals.

10. The imaging apparatus of claim 5, wherein said first sampling capacitor is configured to settle to a voltage difference between said photo and reset signals.

* * * * *